(12) United States Patent
Schlager et al.

(10) Patent No.: US 6,236,607 B1
(45) Date of Patent: May 22, 2001

(54) INTEGRATED MEMORY HAVING A REFERENCE POTENTIAL AND OPERATING METHOD FOR SUCH A MEMORY

(75) Inventors: Tobias Schlager, Kumberg (AT); Zoltan Manyoki, CDN-Kanata (CA); Robert Esterl, München (DE)

(73) Assignee: Infineion Technologies AG, Munich (DE)

( * ) Notice: Subject to any disclaimer, the term of this patent is extended or adjusted under 35 U.S.C. 154(b) by 0 days.

(21) Appl. No.: 09/574,701

(22) Filed: May 18, 2000

(30) Foreign Application Priority Data

May 18, 1999 (DE) ............................................. 199 22 765

(51) Int. Cl.$^7$ ................................................... G11C 7/02
(52) U.S. Cl. ................................................ 365/210; 365/145
(58) Field of Search .................................... 365/210, 145, 365/189.01, 189.07, 203, 207

(56) References Cited

U.S. PATENT DOCUMENTS

| 5,416,371 | 5/1995 | Katayama et al. | 327/57 |
| 5,822,237 | 10/1998 | Wilson et al. | 365/145 |
| 5,844,832 | 12/1998 | Kim | 365/145 |
| 6,075,738 | * 6/2000 | Takano | 365/210 |

\* cited by examiner

*Primary Examiner*—David Nelms
*Assistant Examiner*—David Lam
(74) *Attorney, Agent, or Firm*—Herbert L. Lerner; Laurence A. Greenberg; Werner H. Stemer

(57) ABSTRACT

The memory has a control unit, which, in order to generate a common reference potential on the two bit lines, turns on the first switching element and the selection transistors of the two reference memory cells and, after a specific time period, turns off the selection transistors, while the first switching element remains in the on state and compensates for a potential difference between the two bit lines.

8 Claims, 4 Drawing Sheets

INTEGRATED MEMORY HAVING A REFERENCE POTENTIAL AND OPERATING METHOD FOR SUCH A MEMORY

BACKGROUND OF THE INVENTION

FIELD OF THE INVENTION

The invention relates to an integrated memory having a reference potential, and to an operating method for such a memory.

U.S. Pat. Nos. 5,844,832 and 5,822,237 describe ferroelectric memories of the FRAM or FeRAM type (Ferroelectric Random Access Memory) of the 1-transistor/1-capacitor type. Such memories are constructed similarly to DRAMs (Dynamic Random Access Memories) but their storage capacitors have a ferroelectric dielectric. Their bit lines are connected in pairs to differential sense amplifiers. In the event of a read access, a datum is transferred from one of the memory cells to the sense amplifier via one of the bit lines of the bit line pairs, while a reference potential is generated on the other bit line of the bit line pair. The sense amplifier subsequently amplifies the differential signal present at its inputs to full logic levels.

In the circuits described in the two U.S. patents, the reference potential is generated by different states being stored in two reference memory cells connected to different bit lines. This means that the ferroelectric dielectric of the storage capacitors of the reference memory cells, which are constructed in exactly the same way as the normal memory cells of the memory, is polarized differently. Afterwards, the states stored in the reference memory cells are read out onto the associated bit lines and the two bit lines are short-circuited, with the result that a common reference potential is finally established on both bit lines.

According to U.S. Pat. No. 5,844,832, firstly the reference memory cells are read onto the associated bit lines by their selection transistors being turned on via a reference word line, and then the two bit lines are short-circuited in order to generate the reference potential. According to U.S. Pat. No. 5,822,237 the bit lines are short-circuited during a period of time in which the selection transistors of the reference memory cells are also in the on state. In another variant presented in U.S. Pat. No. 5,822,237, the short-circuiting transistor connects to one another not the two bit lines that are connected to the reference memory cells, but, within the reference memory cells, directly the storage capacitors thereof. In that variant, in order to generate the reference potential, firstly the short-circuiting transistor is turned on, so that charge balancing takes place between the two reference memory cells, before the reference word line is activated and the selection transistors of the reference memory cells are turned on. Before the selection transistors are turned on, the short-circuiting transistor is turned off.

In those prior art memories in which the short-circuiting of the bit lines or reference memory cells and the turning-on of their selection transistors are effected successively, a relatively long time period is required for generating the reference potential. In the other above-mentioned prior art memories, the selection transistors of the reference memory cells are in the on state the whole time while the short-circuiting transistor is in the on state and carries out complete charge balancing between the bit lines. This has the disadvantage that, during the charge balancing, the non-linear capacitances of the ferroelectric storage capacitors of the reference memory cells affect the reference potential to be generated. By contrast, the bit line capacitances are linear.

In memories in which firstly the reference memory cells are read onto the bit lines and, after their selection transistors have been turned off, then the bit lines are short-circuited, a reference potential is established on the bit lines which corresponds to the arithmetic mean of the potentials established on the bit lines during the reading of the reference memory cells. As a result of the non-linear capacitances of the storage capacitors, by contrast, a different value of the reference potential is produced if the selection transistors and the short-circuiting transistor are simultaneously in the on state.

SUMMARY OF THE INVENTION

It is accordingly an object of the invention to provide an integrated memory of the above-described type and an associated operating method, which overcome the above-mentioned disadvantages of the heretofore-known devices and methods of this general type and in which the reference potential is generated in a manner in which the influence of the non-linear capacitances of the storage capacitors of the reference memory cells is reduced by comparison with the prior art, and in which the reference potential can nevertheless be generated in a relatively short time.

With the foregoing and other objects in view there is provided, in accordance with the invention, an integrated memory, comprising:

two bit lines and memory cells arranged along the two bit lines;

first and second reference memory cells each having a selection transistor connected to one of the bit lines;

a first switching element connecting the bit lines to one another;

a writing unit connected to the reference memory cells for storing a first state in the first reference memory cell and a second state in the second reference memory cell;

a control unit connected to the first switching element, the control unit generating a common reference potential on the two bit lines by first turning on the first switching element and the selection transistors of the two reference memory cells and, after a specific time period, turning off the selection transistors while the first switching element remains on and compensates for a potential difference between the two bit lines.

In other words, both the first switching element which short-circuits the two bit lines and the selection transistors of the two reference memory cells are firstly turned on. After a specific time period, the selection transistors are turned off, while the first switching element remains in the on state and compensates for a potential difference between the two bit lines.

The selection transistors of the reference memory cells are thus turned off at such an early point in time that complete charge balancing between the two bit lines has not yet taken place. Consequently, the influence of the non-linear storage capacitances of the reference memory cells on the reference potential that is established is less than if the selection transistors were in the on state until complete charge balancing between the two bit lines. Since both the selection transistors and the first switching element are simultaneously in the on state during the specific time period, the reading of the reference memory cells and the charge balancing between the bit lines are advantageously not effected sequentially but rather—at least partly—temporally in parallel. This results in a relatively short time being required to generate the reference potential.

It is favorable if the first switching element is turned on at the latest at the same time as the selection transistors. In that case, the charge balancing between the bit lines begins at the very point when the selection transistors are turned on.

In accordance with an added feature of the invention, the control unit which drives the first switching element and the selection transistors contains programmable elements for setting the specific time period. The programmable elements enable the specific time period to be chosen such that a desired reference potential is produced.

In accordance with an additional feature of the invention, the programmable elements are reversibly programmable elements. The specific time period can thus be changed, thereby enabling adaptation of the reference potential that is established.

In accordance with another feature of the invention, an evaluation circuit for determining the specific time period, the evaluation circuit ascertaining when a potential of the two bit lines has a same quantitative difference with respect to the desired reference potential with the selection transistors in an on state and the first switching element in an on state, and, depending on a determined result, the evaluation circuit programming the programmable elements of the control unit. In this memory, then, the specific time period is automatically programmed by the memory.

In accordance with a further feature of the invention, the control unit, for determining the reference potential, turns on the selection transistors of the reference memory cells and subsequently, once the selection transistors are turned off, the first switching element;

a storage unit is connected for storing the reference potential established on the two bit lines in the process; and the evaluation circuit has a comparison unit for comparing the stored reference potential with the potential of the two bit lines.

In accordance with again a further feature of the invention, the memory further comprises third and fourth bit lines constructed identically to the first and second bit lines, the third and fourth bit lines having two reference memory cells for storing two different states and a second switching element connecting the third and fourth bit lines;

a further control unit adapted to determine the reference potential by first turning on the selection transistors of the two reference memory cells of the third and fourth bit lines and then, once the selection transistors are turned off, turning on the second switching element;

a storage unit connected to the third and fourth bit lines for storing the reference potential produced on the third and fourth bit lines in the process; and wherein the evaluation circuit has a comparison unit for comparing the stored reference potential with the potential of the first and second bit lines or of the third and fourth bit lines.

In other words, according to these further developments of the invention, the control unit, for determining the reference potential, turns on firstly the selection transistors of the reference memory cells and then, once the selection transistors are turned off again, the first switching element, whereupon the reference potential established on the two bit lines is stored in a storage unit. The evaluation circuit has a comparison unit for comparing the stored reference potential with the potential of the two bit lines.

In this development, the control unit determines the reference potential established on the bit lines when the selection transistors and the first switching element are turned on successively. By means of the comparison unit, the evaluation circuit can ascertain the point in time at which, with the selection transistors in the on state and, at the same time, the first switching element in the on state, the two bit lines have potentials which deviate from the reference potential stored in the storage unit by the same absolute value. In this way, the evaluation circuit determines the specific time period. The evaluation circuit can thereupon perform corresponding programming of the programmable elements of the control unit.

The determination of the reference potential and of the specific time period can also be carried out by means of a third and a fourth bit line, which are provided in addition to the first and second bit line.

With the above and other objects in view there is also provided in accordance with the invention, a method of operating an integrated memory having memory cells arranged along two bit lines; two reference memory cells each having a selection transistor, via which they are respectively connected to one of the bit lines; and a first switching element, via which the bit lines are connected to one another; the method comprises the following method steps:

storing different states in the two reference memory cells;

turning on the first switching element and the selection transistors of the two reference memory cells;

subsequently, in order to generate a common reference potential on the two bit lines, after a specific time period, turning off the selection transistors, while the first switching element remains in an on state and compensates for a potential difference between the two bit lines.

In accordance with a concomitant feature of the invention, the first switching element is turned on no later than at the same time as the selection transistors.

Other features which are considered as characteristic for the invention are set forth in the appended claims.

Although the invention is illustrated and described herein as embodied in an integrated memory having a reference potential and operating method for such a memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
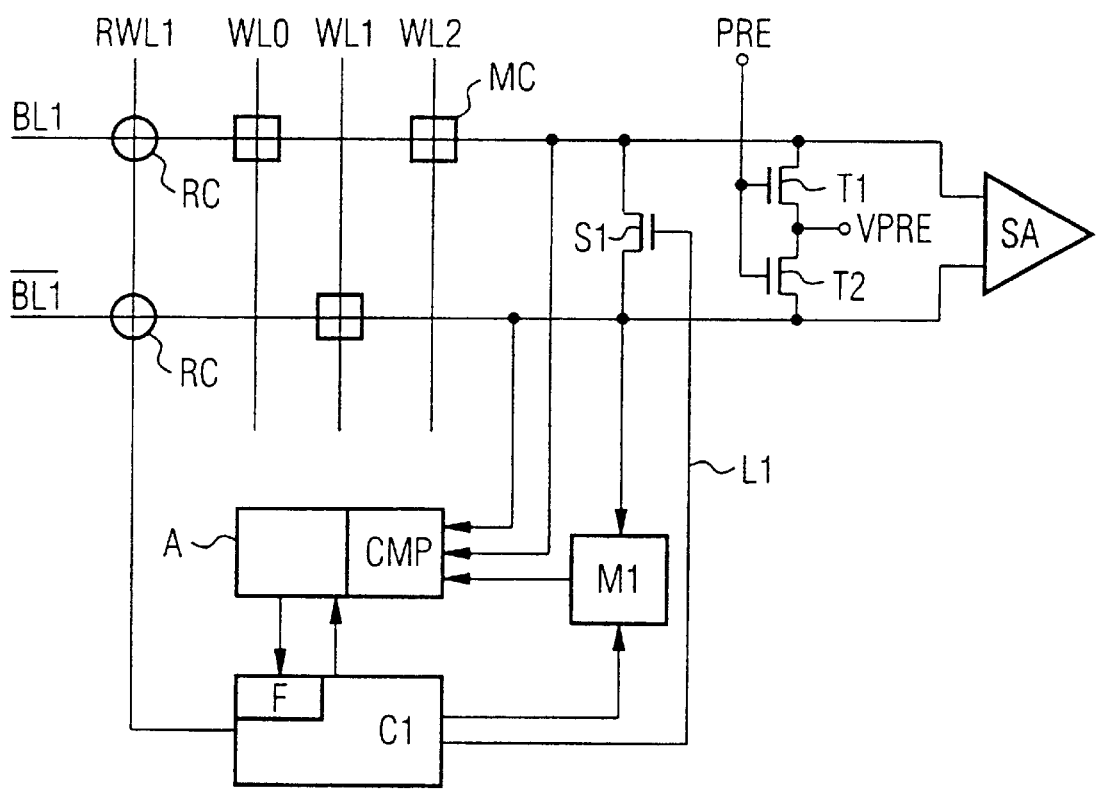
FIG. 1 is a block circuit diagram of an exemplary embodiment of the integrated memory according to the invention.
Figure 2:
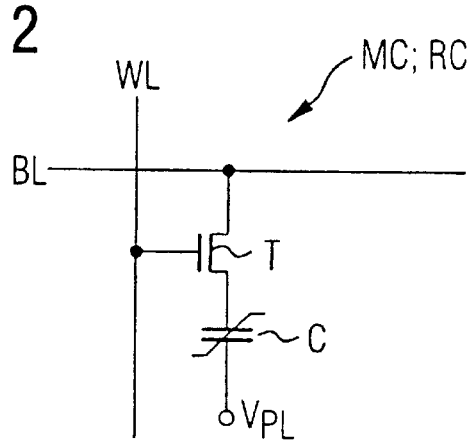
FIG. 2 is a structural diagram of a memory cell or of a reference memory cell of the memory of FIG. 1.

Referring now to the figures of the drawing in detail and first, particularly, to FIGS. 1 and 2 thereof, there is shown a first exemplary embodiment of the integrated memory according to the invention. The exemplary memory is an FRAM, whose memory cells MC and reference memory cells RC are constructed identically. FIG. 2 shows the structure of one of the memory cells MC or reference memory cells RC. The cells are of the 1-transistor/1-capacitor type. One electrode of a storage capacitor with a ferroelectric dielectric is connected to a plate potential VPL and the other electrode is connected to an associated bit line BL via a selection transistor T. The gate of the selection transistor T is connected to an associated word line WL. The memory cells MC are arranged at crossover points of bit lines BL1, /BL1 and word lines WLi. The reference memory cells RC are arranged at crossover points of the two bit lines BL1, /BL1 with a reference word line RWL1.

The two bit lines BL1, /BL1 are connected to a differential sense amplifier SA. Moreover, they are connected to one another via a first switching element S1 in the form of an n-channel transistor. The two bit lines are connected to a precharge potential VPRE via a respective n-channel transistor T1, T2. The gates of the n-channel transistors T1, T2 are connected to a precharge control line PRE. Although the two bit lines BL1, /BL1 in FIG. 1 are assigned to a common sense amplifier SA, in other exemplary embodiments of the invention they may also be assigned to different sense amplifiers SA, as is the case in U.S. Pat. No. 5,844,832 and U.S. Pat. No. 5,822,237.

The memory has a control unit C1 for driving the reference word line RWL1 and the first switching element S1. Moreover, it has a storage unit M1 for storing the potential of the second bit line /BL1. An evaluation circuit A serves for detecting the potential of the two bit lines BL1, /BL1 and contains a comparison unit CMP, which compares the potential of the two bit lines with the potential stored in the storage unit M1. The control unit C1 contains programmable elements F for setting a specific time period, during which the reference word line RWL1 is activated in the event of a read access, with the result that the selection transistors T of the reference memory cells RC are turned on. The control unit C1 is connected to the gate of the first switching element S1 via a control line L1.

The storage unit M1 may be realized by a corresponding storage capacitance, for example. The programmable elements F may be realized for example by electrically programmable fuses or by a multiply programmable electrical memory (for example EEPROM or FRAM).

The programmable elements F are programmed depending on a result determined by the evaluation circuit A. To that end, a reference potential that is intended to be generated on the two bit lines BL1, /BL1 during subsequent operation of the memory is first of all stored in the storage unit M1.

Figure 3:
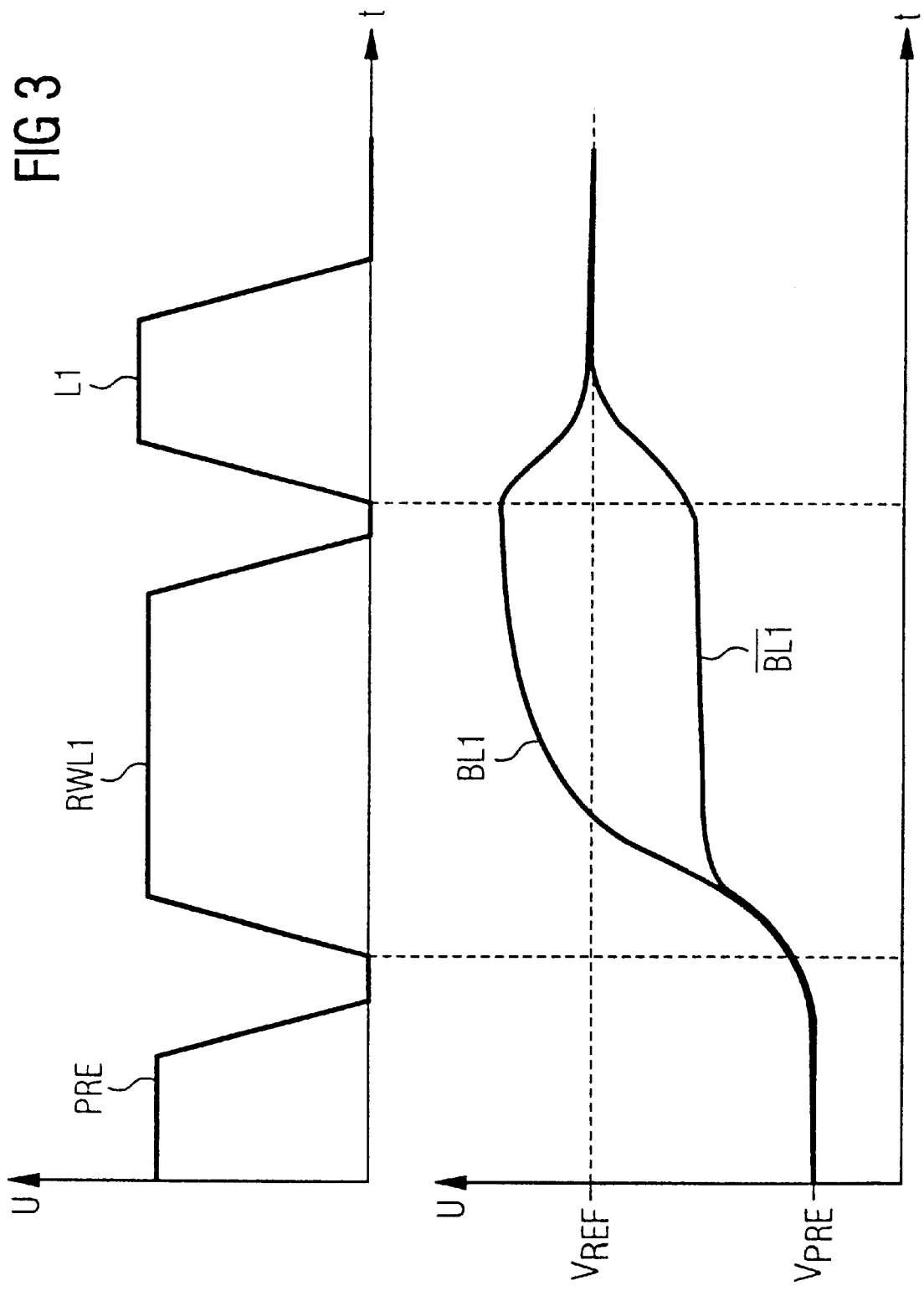
FIG. 3 is a graph showing signal profiles relating to the memory from FIG. 1, when firstly the reference memory cells are read and then the bit lines are short-circuited.

The desired reference potential VREF is generated in the manner illustrated in FIG. 3. Firstly, the two bit lines BL1, /BL1 are precharged to the precharge potential VPRE by the precharge control line PRE being brought to a high potential. Afterward, the two n-channel transistors T1, T2 are turned off and the reference word line RWL1 is activated by the control unit C1. The control line L1 has a low level in the meantime. By virtue of the high level of the reference word line RWL1, the selection transistors T of the reference memory cells RC are turned on and charge balancing takes place between the storage capacitors C of the reference memory cells RC and the bit lines BL1, /BL1. At an earlier point in time, via the sense amplifier SA, a logic one had already been written to the reference memory cell RC connected to the first bit line BL1 and a logic zero had already been written to the reference memory cell connected to the second bit line /BL1. The ferroelectric dielectric of the storage capacitors C of the reference memory cells RC were polarized differently in the process in accordance with the logic state written. The different polarization results in a different capacitance of the storage capacitors C.

According to FIG. 3, different potentials are therefore established on the two bit lines BL1, /BL1 during the reading of the two reference cells RC (high level of the reference word line RWL1). Once the selection transistors are turned off again, the two bit lines BL1, /BL1 are short-circuited by the activation of the control line L1, which turns on the first switching element S1. Charge balancing is thereupon effected between the two bit lines and the common reference potential VREF is established on the two bit lines, said reference potential corresponding to the arithmetic mean of the potentials present on the two bit lines before the bit lines are short-circuited. This reference potential VREF is now stored in the storage unit M1.

Figure 4:
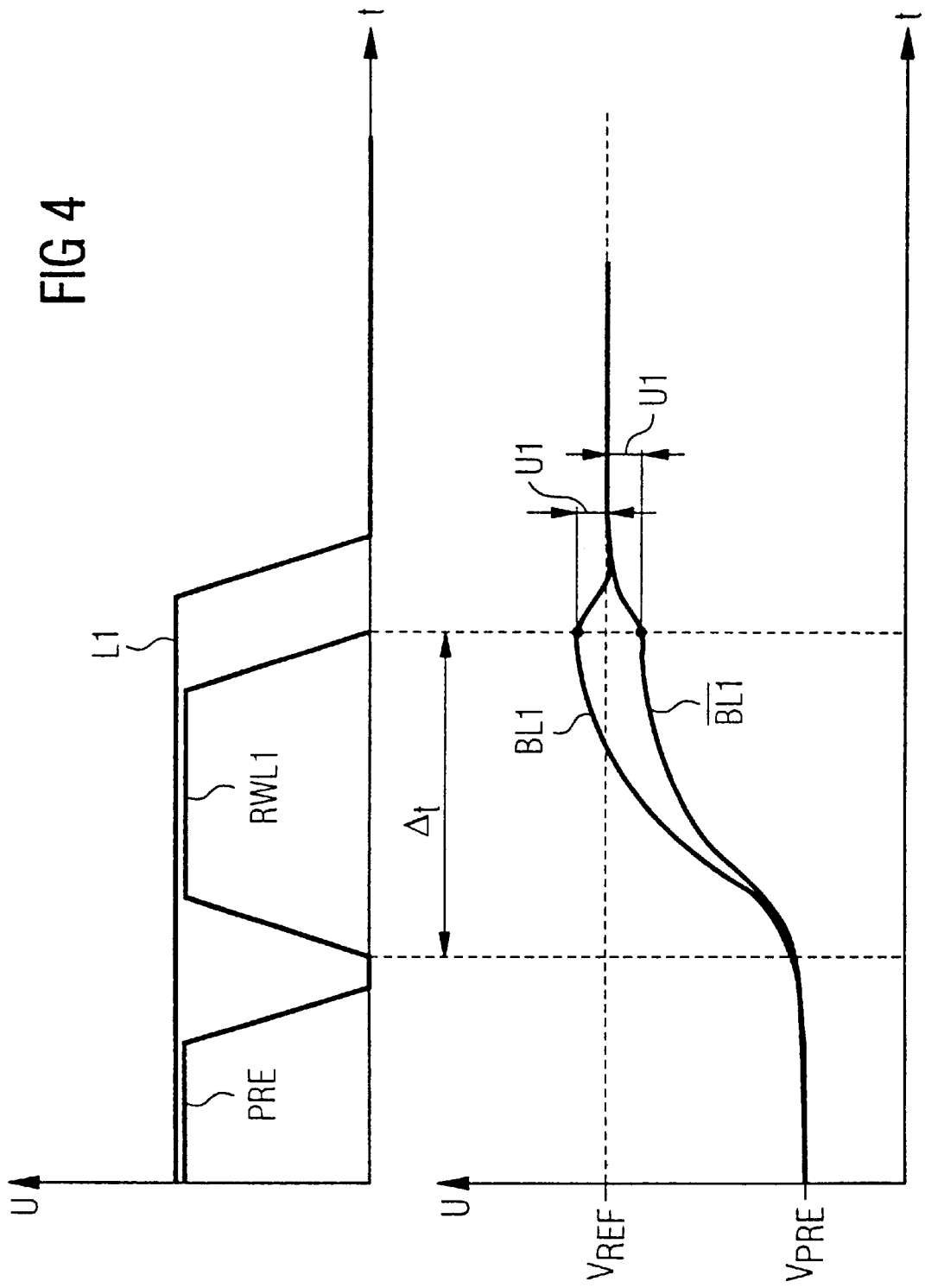
FIG. 4 is a graph showing signal profiles relating to the memory from FIG. 1, when reading of the reference memory cells and short-circuiting of the bit lines are effected simultaneously.

If the reference potential VREF were generated in the manner that has been explained with reference to FIG. 3 in the event of each regular read access to one of the memory cells MC, a relatively long time would be required to do so. This is because the reading of the reference memory cells RC and the short-circuiting of the bit lines BL1, /BL1 are effected successively in that case. For this reason, in the case of the memory according to the invention, the generation of the reference potential VREF in the event of a regular read access is effected in the manner illustrated in FIG. 4. The first switching element S1 is turned on via the control line L1 at such an early point that the precharge control line PRE still has a high level, that is to say before the selection transistors T of the reference memory cells RC are turned on. The consequence of this is that during the reading of the memory cells RC, the potentials on the two bit lines BL1, /BL1 change as shown in FIG. 4. The selection transistors T are turned on via the reference word line RWL1 only during a specific time period $\Delta t$, at the end of which the potentials of the two bit lines BL1, /BL1 deviate from the desired reference potential VREF by the same absolute value U1. Once the selection transistors T have been turned off, the first switching element S1 ensures that the potential difference 2U1 between the two bit lines BL1, /BL1 is completely compensated for, with the result that the reference potential VREF is subsequently present on both bit lines.

A juxtaposition of FIG. 4 with FIG. 3 reveals that the reference potential VREF is generated on the bit lines BL1, /BL1 in a very much shorter time in the manner according to the invention than is the case with sequential activation of the reference word line RWL1 and of the control line L1 in accordance with FIG. 3.

In the case of the memory illustrated in FIG. 1, the storage—already described—of the reference potential VREF generated in accordance with FIG. 3 in the storage unit M1 is followed by programming of the programmable elements F by the reference word line RWL1 and the control line L1 being driven in the manner shown in FIG. 4. While the reference word line RWL1 is activated, the evaluation circuit A continuously determines the difference between the potentials of the two bit lines BL1, /BL1 and the reference potential VREF stored in the storage unit M1. In this case, the comparison unit CMP of the evaluation circuit A ascertains the point in time at which the potential differences between the potentials of the two bit lines and the reference potential VREF have the same absolute value U1. The specific time period $\Delta t$—determined in this way—during which the reference word line RWL1 must be activated is subsequently stored by programming the programmable elements F in the control unit C1. In the event of subsequent regular read accesses to the memory, the reference potential VREF is generated only in the manner illustrated in FIG. 4, without the storage unit M1 and the evaluation circuit A being required again.

The programmable elements F are reversibly programmable, with the result that their renewed programming can be carried out anew in the manner just described for example in the event of every initialization of the memory.

Figure 5:
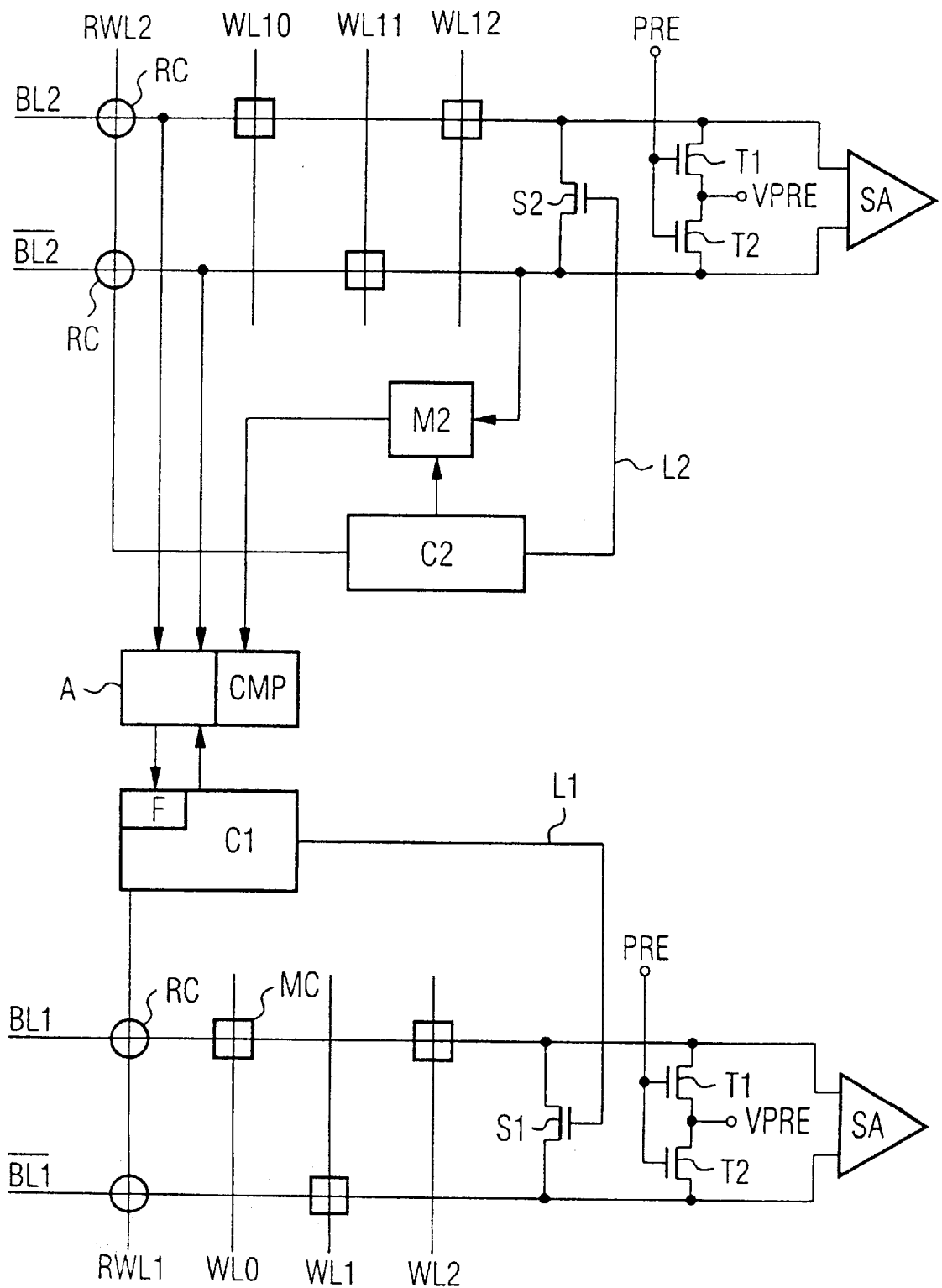
FIG. 5 is a block circuit diagram of further components of another exemplary embodiment of the integrated memory according to the invention.

FIG. 5 shows a second exemplary embodiment of the integrated memory according to the invention. This memory has a third bit line BL2 and a fourth bit line /BL2, which are constructed identically to the first bit line BL1 and the second bit line /BL1. The third and fourth bit lines BL2, /BL2 are assigned a further control unit C2, which is connected to the reference word line RWL2 thereof and, via a further control line L2, to the gate of a second switching element S2, which connects the two bit lines BL2, /BL2.

The third and fourth bit lines BL2, /BL2 are not used for normal operation of the memory, but rather only for determining the desired reference potential VREF in the manner described with reference to FIG. 3. By sequential activation firstly of the reference word line RWL2 and then of the control line L2, the reference potential VREF is generated and is stored in a storage unit M2. The reference word line RWL2 and the further control line L2 are subsequently driven in the manner which is shown in FIG. 4 and has already been described further above. The evaluation circuit A again determines the duration of the specific time period Δt during which the reference word line RWL2 must be activated in order to obtain the same quantitative difference U1 between the potentials of the bit lines BL2, /BL2 and the reference potential VREF stored beforehand in the storage unit M2. The programmable elements F of the control unit C1 are subsequently programmed, with the result that the specific time period Δt is stored.

In the event of subsequent regular read accesses to the memory cells MC of the first and second bit lines BL1, /BL1, the reference potential VREF is then generated only in the manner illustrated in FIG. 4, the control unit C1 performing the activation of the reference word line RWL1 in accordance with the programming of the programmable elements F for the specific time period Δt.

In the case of the memory illustrated in FIG. 5, therefore, the third and the fourth bit lines BL2, /BL2 serve for determining the reference potential VREF and the specific time period Δt, depending on which the reference word line RWL1 and the control line L1 of the first and of the second bit line BL1, /BL1 are subsequently driven. In this case, the third and the fourth bit lines BL2, /BL2 do not serve for storing data during normal operation of the memory, but rather only for determining the reference potential VREF and the specific time period Δt. These two bit lines BL2, /BL2 can therefore be arranged such that they are spatially separate from the conventional cell arrays of the memory, the first and the second bit line BL1, /BL1 constituting parts of the said cell arrays.

Although only two bit lines BL1, /BL1 which are provided for memory accesses during normal operation of the memory have been presented in the exemplary embodiments illustrated in FIGS. 1 and 5, in reality there are a very much larger number of bit lines. The control unit C1 serves for driving corresponding reference word lines RWL1 and first switching elements S1 of all these bit lines. Therefore, the storage of the predetermined time period Δt by means of the programmable elements F have to be effected only once for the entire integrated memory.

In other exemplary embodiments of the invention, it is also possible for there not to be an evaluation circuit A and a storage unit M1, M2, rather for the programmable elements F to be programmed from outside the memory.

By way of example, the specific time period Δt can be determined by means of a counter contained in the evaluation circuit A.

We claim:

1. An integrated memory, comprising:

two bit lines and memory cells arranged along said two bit lines;

first and second reference memory cells each having a selection transistor connected to one of said bit lines;

a first switching element connecting said bit lines to one another;

a writing unit connected to said reference memory cells for storing a first state in said first reference memory cell and a second state in said second reference memory cell;

a control unit connected to said first switching element, said control unit generating a common reference potential on said two bit lines by first turning on said first switching element and said selection transistors of said two reference memory cells and, after a specific time period, turning off said selection transistors while said first switching element remains on and compensates for a potential difference between said two bit lines.

2. The integrated memory according to claim 1, wherein said control unit contains programmable elements for setting the specific time period.

3. The integrated memory according to claim 2, wherein said programmable elements are reversibly programmable elements.

4. The integrated memory according to claim 2, which comprises an evaluation circuit for determining the specific time period, said evaluation circuit ascertaining when a potential of said two bit lines has a same quantitative difference with respect to the desired reference potential with said selection transistors in an on state and said first switching element in an on state, and, depending on a determined result, said evaluation circuit programming said programmable elements of said control unit.

5. The integrated memory according to claim 4, wherein said control unit, for determining the reference potential, turns on said selection transistors of said reference memory cells and subsequently, once said selection transistors are turned off, said first switching element;

a storage unit is connected for storing the reference potential established on said two bit lines in the process; and said evaluation circuit having a comparison unit for comparing the stored reference potential with the potential of said two bit lines.

6. The integrated memory according to claim 4, wherein said two bit lines are first and second bit lines and the memory further comprises third and fourth bit lines constructed identically to said first and second bit lines, said third and fourth bit lines having two reference memory cells for storing two different states and a second switching element connecting said third and fourth bit lines;

a further control unit adapted to determine the reference potential by first turning on said selection transistors of said two reference memory cells of said third and fourth bit lines and then, once said selection transistors are turned off, turning on said second switching element;

a storage unit connected to said third and fourth bit lines for storing the reference potential produced on said third and fourth bit lines in the process; and wherein said evaluation circuit has a comparison unit for comparing the stored reference potential with the potential of said first and second bit lines or of said third and fourth bit lines.

7. A method of operating an integrated memory having: memory cells arranged along two bit lines;

two reference memory cells each having a selection transistor, via which they are respectively connected to one of the bit lines; and a first switching element, via which the bit lines are connected to one another;

the method which comprises the following method steps:

storing different states in the two reference memory cells;

turning on the first switching element and the selection transistors of the two reference memory cells;

subsequently, in order to generate a common reference potential on the two bit lines, after a specific time period, turning off the selection transistors, while the first switching element remains in an on state and compensates for a potential difference between the two bit lines.

8. The operating method according to claim 7, which comprises turning on the first switching element no later than at the same time as the selection transistors.

* * * * *

UNITED STATES PATENT AND TRADEMARK OFFICE
CERTIFICATE OF CORRECTION

PATENT NO. : 6,236,607 B1
DATED : May 22, 2001
INVENTOR(S) : Tobias Schlager et al.

It is certified that error appears in the above-identified patent and that said Letters Patent is hereby corrected as shown below:

<u>Title page,</u>
Item [73], should read as follows:

-- Assignee: Infineon Technologies AG, Munich (DE) --

Signed and Sealed this

Tenth Day of September, 2002

Attest:

Attesting Officer

JAMES E. ROGAN
Director of the United States Patent and Trademark Office